(12) United States Patent
Isomura et al.

(10) Patent No.: US 12,707,759 B2
(45) Date of Patent: Aug. 11, 2026

(54) LIGHT RECEIVING DEVICE

(71) Applicant: Dexerials Corporation, Tochigi (JP)

(72) Inventors: Takatomo Isomura, Tochigi (JP); Etsuji Omura, Tochigi (JP)

(73) Assignee: Dexerials Corporation, Tochigi (JP)

( * ) Notice: Subject to any disclaimer, the term of this patent is extended or adjusted under 35 U.S.C. 154(b) by 406 days.

(21) Appl. No.: 18/403,695

(22) Filed: Jan. 3, 2024

(65) Prior Publication Data

US 2024/0136451 A1 Apr. 25, 2024

Related U.S. Application Data

(63) Continuation of application No. PCT/JP2021/026314, filed on Jul. 13, 2021.

(51) Int. Cl.
*G02B 19/00* (2006.01)
*H10F 77/40* (2025.01)

(52) U.S. Cl.
CPC .................................. *H10F 77/413* (2025.01)

(58) Field of Classification Search
CPC ............ G02B 19/0028; G02B 19/0076; G02B 19/009
See application file for complete search history.

(56) References Cited

U.S. PATENT DOCUMENTS

2017/0363859 A1* 12/2017 Ramer ................. G02B 17/006

FOREIGN PATENT DOCUMENTS

JP 2014002062 1/2014
JP 2016080556 5/2016

* cited by examiner

*Primary Examiner* — Joseph P Martinez
(74) *Attorney, Agent, or Firm* — JCIPRNET

(57) ABSTRACT

A light receiving device comprises a condensing lens, a lens holder for mounting the condensing lens, a semiconductor light receiving element, and a lens holder, and the light transmitted through the condensing lens enters the semiconductor light receiving element via the optical path section in the lens holder. The condensing lens is a compound eye lens with a plurality of convex lens surfaces on one side, and the lens holder connects the condensing lens to the semiconductor light receiving element, and has a cylindrical reflective surface facing the optical path section formed in such a way that the diameter and a diameter decreasing rate become smaller as it approaches the semiconductor light receiving element.

7 Claims, 8 Drawing Sheets

LIGHT RECEIVING DEVICE

CROSS-REFERENCE TO RELATED APPLICATION

This application is a continuation of the International PCT application serial no. PCT/JP2021/026314, filed on Jul. 13, 2021. The entirety of the above-mentioned patent application is hereby incorporated by reference herein and made a part of this specification.

TECHNICAL FIELD

The present invention relates to a light receiving device installed in a measuring instrument such as a spectroscopic analysis device, and particularly to a light receiving device that receives infrared light.

BACKGROUND ART

Conventionally, measurement instruments for spectroscopic analysis and the like have utilized light receiving devices for detecting the absorption spectrum of a specimen in an infrared light region, for example. Such light receiving devices are required to detect weak optical signals for highly accurate analysis. Therefore, in order to increase the amount of light received by increasing the light receiving area and to improve the signal-to-noise ratio, there is a need to suppress the dark current of semiconductor light receiving elements, which is one of the main causes of noise.

It is known that dark current can be reduced by reducing the area of a semiconductor light receiving element (photodiode) installed in a light receiving device. However, when the area of the semiconductor light receiving element is reduced, the area for receiving light becomes smaller, and the amount of light received decreases. Therefore, increasing the amount of received light and suppressing dark current are in a contradictory relationship, and it is not easy to achieve both.

For this reason, there is known a light receiving unit configured to condense light onto a light receiving element using a condensing lens, as disclosed in Patent Document #1, for example. The light that is incident parallel to the optical axis of the condensing lens is condensed by the condensing lens, which receives light over a wider area than the light receiving element, and then enters the light receiving element. The proportion of light that enters the area (coupling efficiency) increases.

However, in spectroscopic analysis, most of the light received by the condensing lens is diffused light scattered by the specimen. Therefore, as shown in the ray tracing simulation results in FIG. 17, for example, most of the diffused light that enters the plano-convex lens 30 as a condensing lens becomes stray light and cannot be made to enter the light receiving element 31. The coupling efficiency in this case is 21%.

On the other hand, a reflecting mirror is known that reflects diffused light incident from various directions on the inner surface of a conical cylinder, as disclosed in Patent Document #2, for example. For example, as shown in the ray tracing simulation results in FIG. 18, when a conical cylindrical reflecting mirror 32 is installed and the light is incident on the light receiving element 31, some of the light that enters the reflecting mirror 32 is incident on the light receiving element 31. The light percentage (coupling efficiency) is 20%.

PRIOR ART DOCUMENTS

Patent Documents

Patent Document #1: Japanese Patent Application Publication No. 2014-2062

Patent Document #2: Japanese Patent Application Publication No. 2016-80556

SUMMARY OF THE INVENTION

Problems to be Solved by the Invention

In Patent Documents #1 and #2, the coupling efficiency is about 20%, and there is room for improvement in the coupling efficiency. For example, as shown in FIG. 19, we investigated a case where a plano-convex lens 30 and a reflecting mirror 32 are combined to make the light incident on the light receiving element 31, and as a result, the coupling efficiency was improved to 42%. However, the higher the coupling efficiency, the better and further improvement of the coupling efficiency is required.

An object of the present invention is to provide a light receiving device with improved coupling efficiency when diffused light is incident.

Means to Solve the Problems

The present invention presents a light receiving device comprising a condensing lens, a lens holder that supports the condensing lens, a semiconductor light receiving element, and a base for fixing the semiconductor light receiving element and the lens holder, in which the light transmitted through the condensing lens enters the semiconductor light receiving element through an optical path section in the lens holder; wherein the condensing lens is a compound eye lens having a plurality of convex lens surface on one side, the lens holder has a cylindrical reflective surface facing the optical path section having a circular cross section and formed such that a diameter and a diameter decreasing rate becomes smaller as approaches the semiconductor light receiving element from the condensing lens, and a part of the light transmitted through the condensing lens is reflected by the reflective surface and enters the semiconductor light receiving element.

According to the above configuration, in the light receiving device, a part of the light transmitted through the condensing lens, which is a compound eye lens, travels through the optical path while being reflected by the reflective surface in the lens holder, and enters the semiconductor light receiving element. Since the condensing lens is a compound eye lens, the plurality of convex lens surfaces can condense the diffused light that enters the entire condensing lens from various directions onto the optical path toward the semiconductor light receiving element. The cylindrical reflective surface facing the optical path, whose diameter becomes smaller as it approaches the semiconductor light receiving element and whose diameter decreasing rate becomes smaller as it approaches the semiconductor light receiving element, and the reflective surface reflects and collects a portion of the light that has passed through the condensing lens. The light can be made incident on a semiconductor light receiving element whose diameter is smaller than that of the condensing lens. Therefore, the coupling efficiency when diffused light is incident can be improved.

In a first modified aspect, when a distance from the condensing lens is x on a center line of the reflective surface passing through a center of the condensing lens, a coefficient is a, and an aperture radius of the reflective surface on the condensing lens side is A, the reflective surface is formed along a rotational curved surface obtained by rotating a curved line represented by an exponential function $A\times\exp(-\alpha x)$ about the center line.

According to the above configuration, the diameter of the cylindrical reflective surface decreases exponentially as it gets farther away from the condensing lens and closer to the semiconductor light receiving element, and the diameter decreasing rate decreases as same as above, thereby the reflective surface approach to the center line in parallel. When reflecting the light, this reflective surface has the effect of increasing the component of the light toward the condensing lens in the direction of the center line and decreasing the component of the light toward the semiconductor light receiving element. This effect is alleviated as the cylindrical reflective surface approaches to the center line in parallel as it approaches the semiconductor light receiving element. Therefore, the light that passes through the condensing lens and is reflected and condensed by the reflective surface becomes difficult to return to the condensing lens side when reflected multiple times by the reflective surface, thereby the coupling efficiency can be improved.

In a modified second aspect, when a distance from the condensing lens is x on a center line of the reflective surface passing through a center of the condensing lens, a coefficient is $\alpha$, and an aperture radius of the reflective surface on the condensing lens side is A, the reflective surface is formed along a rotational curved surface obtained by rotating a curved line represented by an approximate polynomial $A\times(1-\alpha x+a(\alpha x)^2-b(\alpha x)^3+c(\alpha x)^4$ that is an expansion of an exponential function $A\times\exp(-\alpha x)$ up to fourth order term about the center line and is formed such that a diameter of the reflective surface on the semiconductor light receiving element side is larger than that is obtained by the exponential function.

According to the above configuration, the cylindrical reflective surface is formed along a rotation curved surface obtained by rotating a curve expressed by an approximate polynomial that approximates an exponential function. The diameter of this reflective surface decreases exponentially and the rate at which the diameter decreases as approaches the semiconductor light receiving element with leaving from the condensing lens. Furthermore, when reflecting light, this reflective surface has the effect of increasing the component of the light toward the condensing lens in the direction of the center line and decreasing the component of the light toward the semiconductor light receiving element. Since the diameter of this reflective surface on the semiconductor light receiving element side is larger than in the case of an exponential function, the reflective surface becomes closer to the center line in parallel on the condensing lens side than in the case of an exponential function, so this effect is alleviated. Therefore, the light that passes through the condensing lens and is reflected and condensed by the reflective surface becomes difficult to return to the condensing lens side when reflected multiple times by the reflective surface, so that the coupling efficiency can be improved.

In a modified third aspect, the coefficient $\alpha$ of the exponential function satisfies $0.1\leq\alpha\leq0.2$.

According to the above configuration, the inclination of the reflective surface with respect to the center line is optimized, and the coupling efficiency when diffused light is incident can be improved.

In a modified fourth aspect, the condensing lens is a compound eye lens comprising a plurality of the convex lens surface having a radius of curvature smaller than that of a partially spherical convex surface that is formed on one side of the condensing lens.

According to the above configuration, the condensing lens is a compound eye lens having a plurality of convex lens surfaces arranged along a partially spherical convex surface. Since the optical axes of the plurality of convex lens surfaces are tilted toward the semiconductor light receiving element, the light transmitted through the condensing lens can be made easier to enter the semiconductor light receiving element.

In a modified fifth aspect, the condensing lens is a compound eye lens such that the farther it is from the center line of the reflective surface passing through the center of the condensing lens, the larger an intersection angle between the center line and the optical axis passing through the center of the convex lens surface.

According to the above configuration, the condensing lens is a compound eye lens having a plurality of convex lens surfaces, and the further away from the center line of the reflective surface passing through the center of the condensing lens, the more the optical axis of the convex lens surface becomes relative to this center line. As a result, the optical axes of the plurality of convex lens surfaces are tilted toward the semiconductor light receiving element, making it easier for the light transmitted through the condensing lens to enter the semiconductor light receiving element.

In a modified sixth aspect, the condensing lens is a compound eye lens in which a plurality of convex lens surfaces are integrally formed on a silicon substrate, and the semiconductor light receiving element receives infrared light.

According to the above configuration, a condensing lens can be formed by integrally forming a plurality of convex lens surfaces on a silicon substrate suitable for high precision processing, and spectroscopic analysis of infrared light transmitted through the silicon substrate can be performed. It is possible to form a light receiving device suitable for spectroscopic analysis of infrared light.

Advantages of the Invention

According to the light receiving device of the present invention, it is possible to improve the coupling efficiency when diffused light is incident.

DESCRIPTION OF EMBODIMENTS

Hereinafter, the configuration for implementing the present invention is demonstrated based on embodiments.

Embodiment

Figure 1:
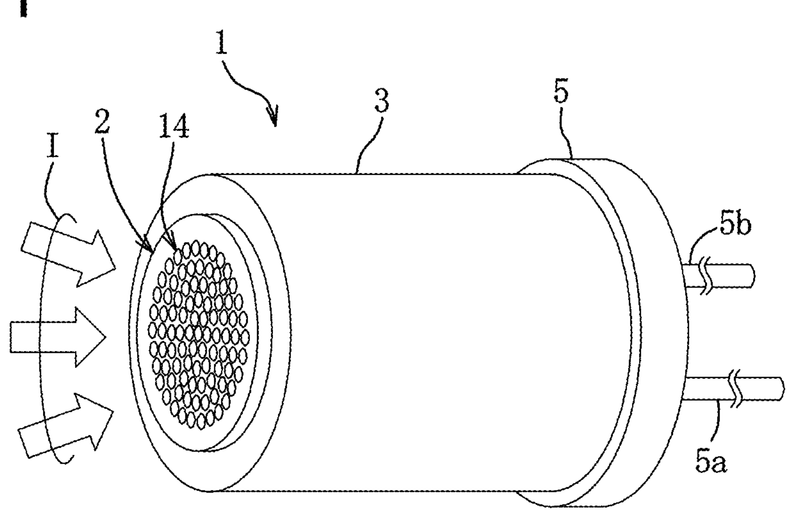
FIG. 1 is an overall view of a light receiving device according to an embodiment of the present invention.
Figure 2:
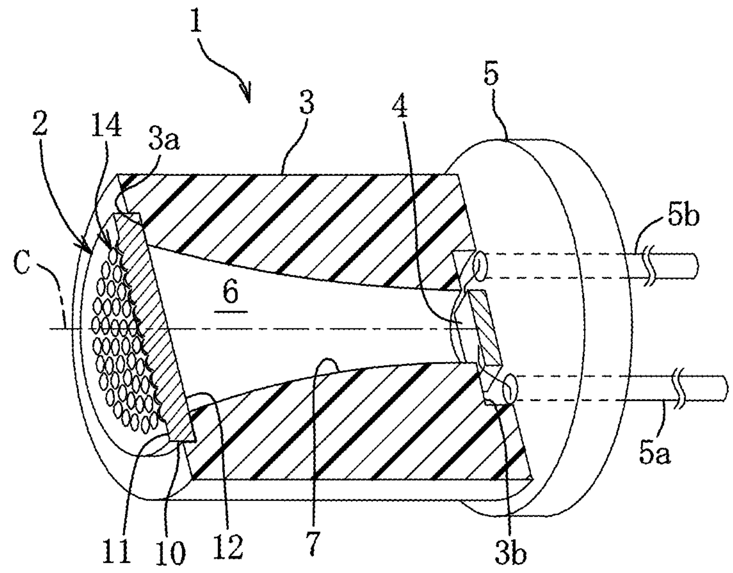
FIG. 2 is a cross-sectional view of a main part of the light receiving device in FIG. 1.

As shown in FIGS. 1 and 2, the light receiving device 1 includes a condensing lens 2, a lens holder 3 that supports the condensing lens 2, a semiconductor light receiving element 4, and a base for fixing the semiconductor light receiving element 4 and the lens holder 3. Then, as shown by arrow I, the light receiving device 1 is configured such that, for example, the diffused light scattered by the specimen enters the condensing lens 2 from various directions, and the light transmitted through the condensing lens 2 enters the semiconductor light receiving element 4.

The semiconductor light receiving element 4 is a photodiode including, for example, an indium phosphide (InP) substrate as a semiconductor substrate and an InGaAs layer as a light absorption layer. This semiconductor light receiving element 4 converts the received infrared light into photocurrent.

An anode electrode and a cathode electrode (not shown) of the semiconductor light receiving element 4 fixed to the base 5 are connected to a pair of output terminals 5*a* and 5*b* of the corresponding base 5 by, for example, metal wires. The light receiving device 1 converts the light transmitted through the condensing lens 2 and received by the semiconductor light receiving element 4 into a photocurrent, and outputs the photocurrent to the outside via a pair of output terminals 5*a* and 5*b*.

The lens holder 3 has a mounting part 3*a* for the condensing lens 2, a housing part 3*b* for the semiconductor light receiving element 4, and an optical path part 6 that communicates the mounting part 3*a* and the housing part 3*b*. This lens holder 3 is formed into a cylindrical shape with a circular or polygonal outer shape by, for example, resin molding. Further, the outer shape of the condensing lens 2 may be circular or polygonal.

The optical path section 6 is formed so that the diameter becomes smaller as it approaches the semiconductor light receiving element 4 housed in the housing section 3*b* from the condensing lens 2 mounted on the mounting section 3*a*, and the rate at which the diameter decreases becomes smaller as it approaches the semiconductor light receiving element 4. A metal reflective film (e.g., Au film, Cr film, etc.) is formed on the surface of the lens holder 3 facing the optical path section 6 by, for example, a vapor deposition method, so that a cylindrical reflective surface 7 surrounding the side surface of the optical path section 6 having a circular cross section is formed. The center line C of this reflective surface 7 is common to the center line of the optical path section 6, and the condensing lens 2 is attached to the attachment section 3*a* so that the center line C passes through the center of the condensing lens 2.

Figure 3:
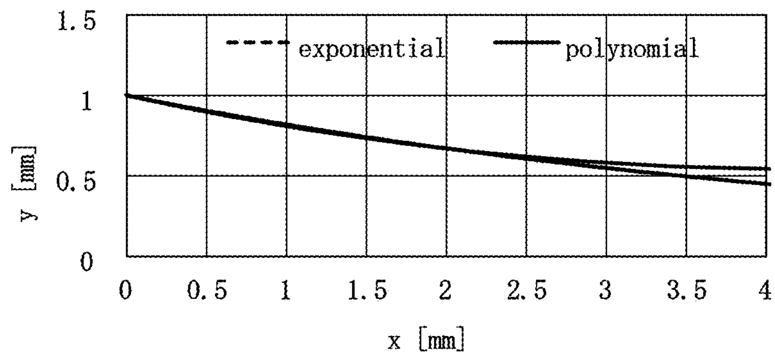
FIG. 3 is a diagram showing an example of a curve to be rotated to form a reflective surface according to the embodiment.

Reflective surface 7 is made as a rotating curved surface by rotating a curved line whose distance y from the x-axis shown in FIG. 3 is expressed by the exponential function of the following equation (1) around the x-axis so that it coincides with the center line C.

$$y = A \times \exp(-\alpha x) \tag{1}$$

In the following, this reflective surface 7 will be defined as a reflective surface 7 expressed by an exponential function. The condensing lens 2 is disposed at the position of x=0, and the coefficient A corresponds to the aperture radius of the reflective surface 7 on the condensing lens 2 side. In addition, in FIG. 3, the coefficient A=1 and α=0.2.

In addition, the reflective surface 7 may be made as a rotating curved surface rotated around the x-axis coincident with the center line C. Distance y is expressed by the approximate polynomial of the following equation (2) which is the expansion of the exponential function of the equation (1) up to the fourth order term.

$$y = A \times \left(1 - \alpha x + a(\alpha x)^2 - b(\alpha x)^3 + c(\alpha x)^4\right) \tag{2}$$

In the following, this reflective surface 7 will be defined as a reflective surface 7 expressed by an approximate polynomial. This approximate polynomial is an approximate expression up to the 4th order term of the polynomial obtained by Taylor expanding the exponential function of equation (1), and the expansion coefficients of the 2nd to 4th order terms are a, b, and c, respectively. The condensing lens 2 is disposed at the position of x=0, and the coefficient A corresponds to the aperture radius of the reflective surface 7 on the condensing lens 2 side. In addition, in FIGS. 3, A=1, α=0.2, a=0.5, b=0.167, and c=0.3.

The condensing lens 2 is a compound eye lens in which a plurality of partially spherical convex lens surfaces 14 integrally formed on a first surface 11 which is one side of a silicon (Si) substrate as a semiconductor substrate 10 made of the material, and the back surface 12 of the first surface 11 is formed flat. This condensing lens 2 is mounted on the mounting section 3*a* of the lens holder 3 so that the flat second surface 12 faces the optical path section 6. The semiconductor substrate 10 forming the condensing lens 2 can transmit infrared light having a wavelength of 1.2 μm or more, for example, and has a refractive index greater than 3.2.

Figure 4:
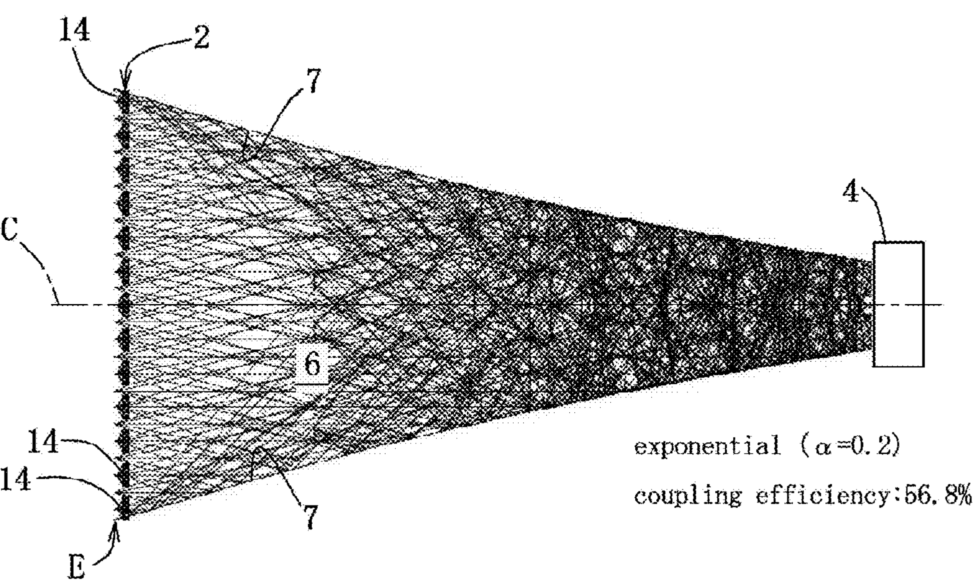
FIG. 4 is an example of ray tracing simulation results in the light receiving device according to the embodiment.

The lens holder 3 to which the condensing lens 2 is attached is positioned so that the center line C of the reflective surface 7 passes through the center of the semiconductor light receiving element 4 is fixed to the base 5 with adhesive, for example. FIG. 4 shows the results of a ray tracing simulation performed on diffused light incident on the light receiving device 1 having the reflective surface 7 expressed by an exponential function.

In the ray tracing simulation, light with a divergence angle (full angle) of 40° is made to enter the condensing lens 2 from a plurality of emission points E set on the first surface 11 side of the condensing lens 2. This reproduces diffused light that enters the entire condensing lens 2 from various directions. Each convex lens surface 14 of the condensing lens 2 is set as a microlens with a diameter of 100 μm, a radius of curvature of 70 μm, and a thickness of 50 μm. A condensing lens 2 (compound eye lens) is reproduced by arranging a plurality of such microlenses at intervals of 50 μm.

The reflective surface 7 is set such that the coefficient A=1 and α=0.2 in the above equation (1) so that all of the plurality of convex lens surfaces 14 of the condensing lens 2 fit inside the reflective surface 7. The length of this reflective surface 7 in the direction of the center line C is set to 3.8 mm, and the light receiving surface of the semiconductor light receiving element 4 is set at a position of x=3.8 mm. The light receiving radius on this light receiving surface is set to, for example, 0.5 mm, and light from the optical path section 6 inside the reflective surface 7 with a radius of 0.47 mm at x=3.8 mm enters the semiconductor light receiving element 4. The center line C of the reflective surface 7 passes through the center of the condensing lens 2 and the center of the light receiving surface of the semiconductor light receiving element 4.

A portion of the light emitted from the plurality of emission points E and transmitted through the condensing lens 2 is reflected one or more times by the reflective surface 7 and travels through the optical path section 6 toward the semiconductor light receiving element 4 and enters to the semiconductor light receiving element 4. Further, some light enters the semiconductor light receiving element 4 without being reflected even once on the reflective surface 7.

The diameter of the reflective surface 7 decreases from the condensing lens 2 side toward the semiconductor light receiving element 4 side. Therefore, when reflecting light, the reflective surface 7 has the effect of increasing the direction component of the light toward the condensing lens 2 side and decreasing the direction component toward the semiconductor light receiving element 4 side in the direction of the center line C (function of returning the light to the condensing lens 2 side).

Figure 5:
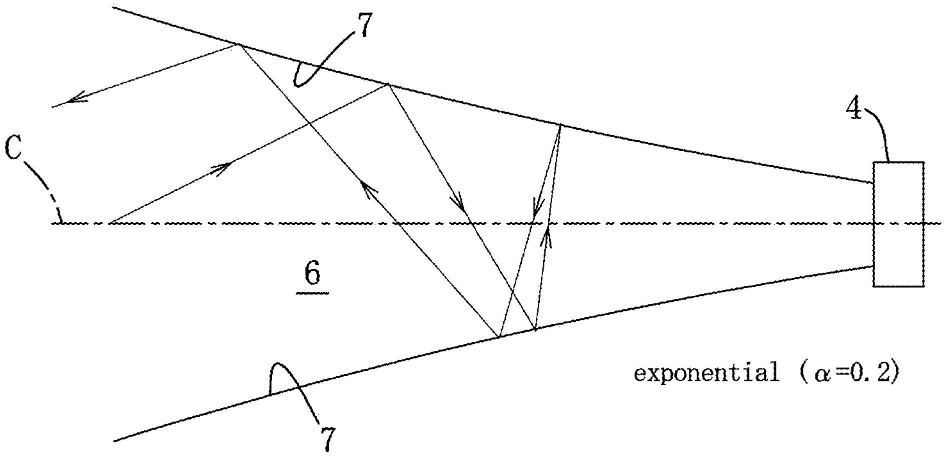
FIG. 5 is an example of a light that returns to the condensing lens side omitted in FIG. 4.

Therefore, although not shown in FIG. 4, some light is reflected multiple times on the reflective surface 7 and returns to the condensing lens 2 side, as shown in FIG. 5, for example, and does not enter the semiconductor light receiving element 4. Note that the condensing lens 2 is omitted in FIG. 5.

Figure 6:
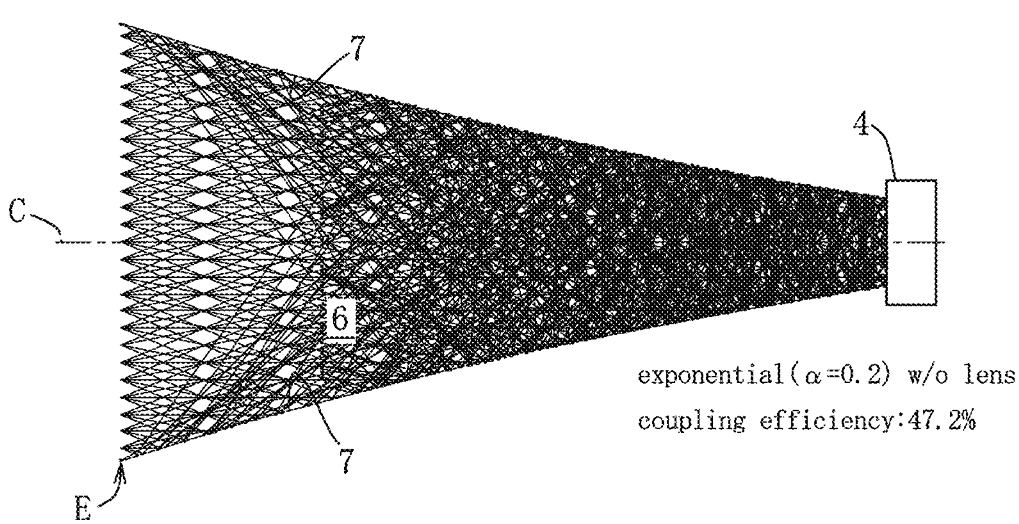
FIG. 6 is an example of a ray tracing simulation result when the condensing lens of the light receiving device in FIG. 4 is removed.

When the rate of light incident on the semiconductor light receiving element 4 to the light incident on the optical path section 6 (light transmitted through the condensing lens 2) is taken as the coupling efficiency, the coupling efficiency in FIG. 4 is 56.8%. On the other hand, as shown in FIG. 6, when the condensing lens 2 of the above configuration is removed and only the reflective surface 7 expressed by an exponential function is provided, the coupling efficiency is 47.2%. The condensing lens 2 condenses the incident diffused light, increasing the amount of light traveling through the optical path section 6 in the direction of the center line C, the light reflected multiple times on the reflective surface 7 and returns to the condensing lens 2 side is reduced and coupling efficiency is improved.

The reflective surface 7, which is expressed by an exponential function, is formed such that the diameter and the diameter decreasing rate become smaller as approaches the semiconductor light receiving element 4 from the condensing lens 2 and approaches to the center line C in parallel with decreasing its inclination.

Figure 18:
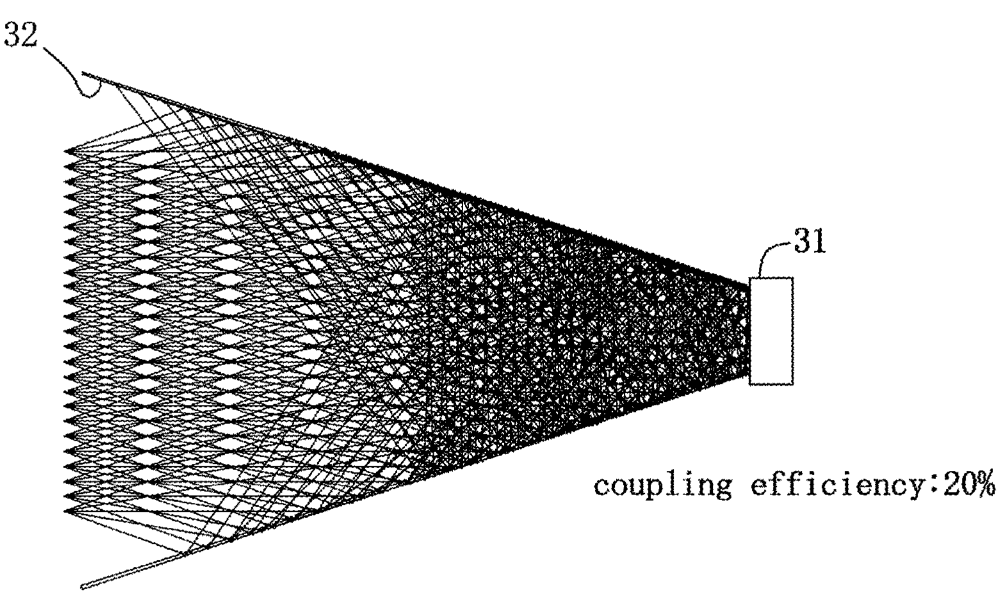
FIG. 18 is an example of a ray tracing simulation result when diffused light is incident on a light receiving device equipped with a reflecting mirror that reflects the light on the inner surface of a conical cylinder.
Figure 19:
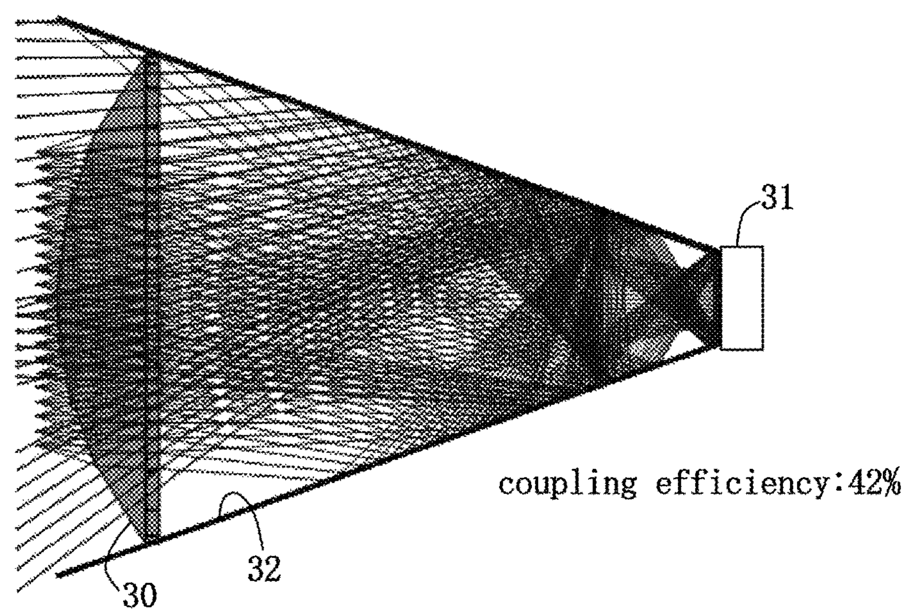
FIG. 19 is an example of a ray tracing simulation result when the plano-convex lens in FIG. 17 and the reflecting mirror in FIG. 18 are combined.

Therefore, the closer to the semiconductor light receiving element 4, the more the effect of the reflective surface 7 on returning the light to the condensing lens 2 is relaxed. Therefore, compared to the conventional truncated cone-shaped reflecting mirror 32 shown in FIG. 18, among the light transmitted through the condensing lens 2 and reflected and condensed by the reflective surface 7, amount of the light reflected a plurality of times by the reflective surface 7 and returns to the condensing lens 2 decreases, thereby the coupling efficiency is improved.

Figure 7:
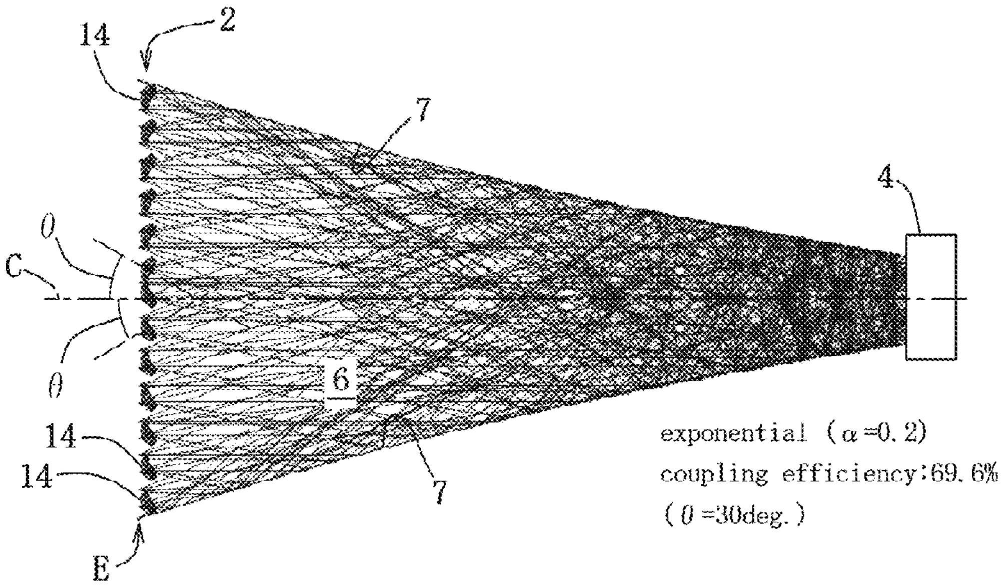
FIG. 7 is an example of a ray tracing simulation result when the optical axes of the plurality of convex lens surfaces in FIG. 4 are tilted.

It is considered that the coupling efficiency is further improved if the plurality of convex lens surfaces 14 of the condensing lens 2 introduce light toward the semiconductor light receiving element 4 side (interior side of the optical path portion 6). Therefore, FIG. 7 shows the ray tracing simulation results when the optical axis of the microlens in FIG. 4 is tilted toward the center line C so that it intersects the center line C at an intersection angle θ=30°. In this case, the coupling efficiency increases to 69.6%.

Figure 8:
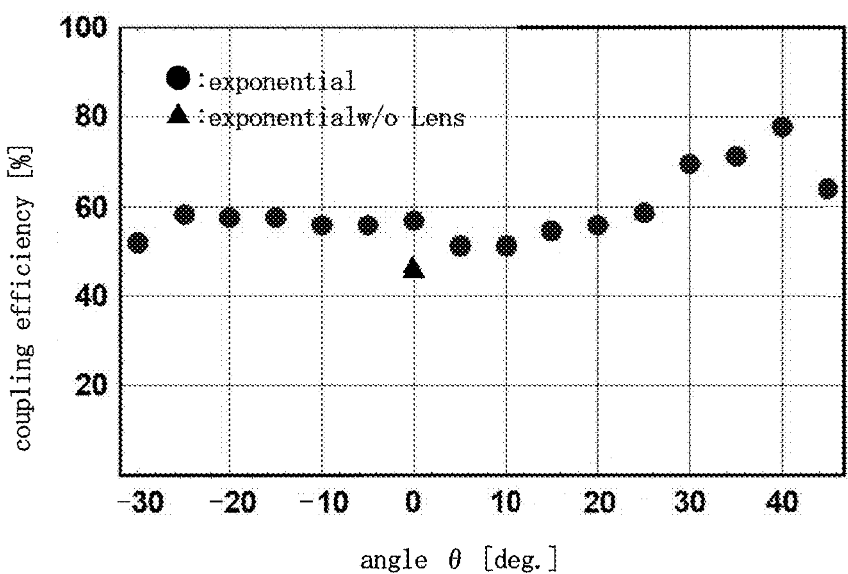
FIG. 8 is a diagram showing the relationship between the inclination of the optical axis of the convex lens surface of a compound eye lens and the coupling efficiency.

FIG. 8 shows the coupling efficiency when the intersection angle θ between the center line C and the optical axes of the plurality of microlenses was increased from −30° to 45° in 5° increments. Note that θ is 0° when the optical axis of the microlens is parallel to the center line C, and θ is negative when the optical axis of the microlens is tilted in a direction that does not intersect the center line C within the optical path section 6.

In FIG. 8, the coupling efficiency is greater than when there is no condensing lens 2 at any intersection angle θ. Further, when the intersection angle θ=25° to 45°, the coupling efficiency is higher than when the intersection angle θ=0°. Therefore, when the condensing lens 2 is a compound eye lens in which the optical axes of the plurality of convex lens surfaces 14 are tilted to intersect the center line C of the reflective surface 7 at an intersection angle of θ=25° to 45°, it is possible to further improve the coupling efficiency. It is easy to understand that even if the optical axes of the multiple convex lens surfaces 14 are not at the same inclination, if the intersection angle is between θ=25° and 45°, the coupling efficiency will be better than when θ=0°.

Figure 9:
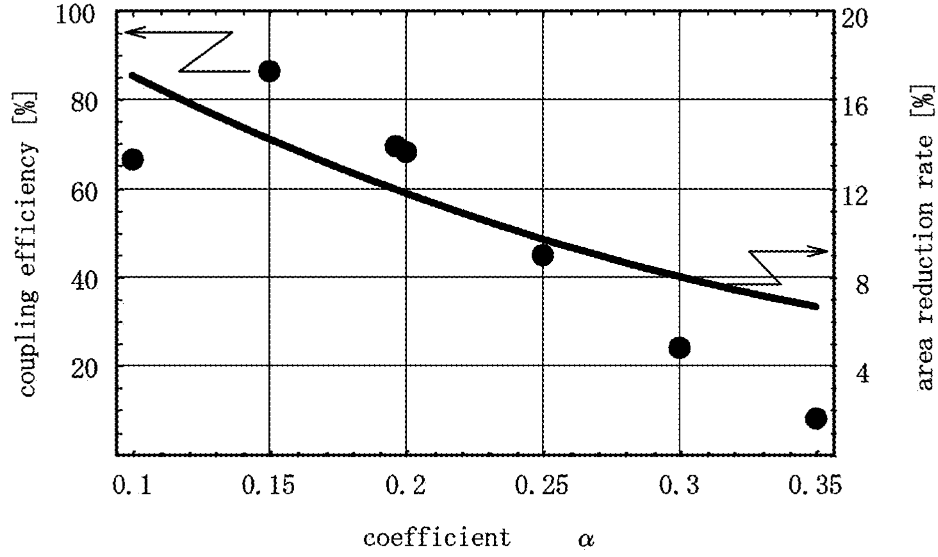
FIG. 9 is a diagram showing the relationship between the coefficient α, the coupling efficiency, and the reduction rate of the passage area of the optical passage section.

The shape of the reflective surface 7 changes depending on the coefficient α, and the coupling efficiency also changes. FIG. 9 shows the relationship between the coefficient α and the coupling efficiency when the coefficient α of the reflective surface 7 expressed by an exponential function is changed when the condensing lens 2 has a intersection angle $\theta=0°$. The smaller the coefficient $\alpha$, the better the coupling efficiency indicated by the circle (●) tends to be, and when the coefficient $\alpha$ is 0.1 to 0.2, a coupling efficiency of over 65% is obtained. The smaller the coefficient $\alpha$ is, the closer the reflective surface 7 is to the center line C in parallel, which makes it easier for the reflective surface 7 to reflect and collect the light that has passed through the condensing lens 2 toward the semiconductor light receiving element 4.

On the other hand, the larger the coefficient $\alpha$ is, the more the reflective surface 7 is inclined with respect to the center line C. Therefore, at a position of a certain distance away from the condensing lens 2 (for example, x=3.8 mm), the reduction rate of the passage area of the optical passage section 6 inside the reflective surface 7 shown by the curve in FIG. 9 become small as the coefficient $\alpha$ become large.

For example, the coefficient $\alpha$ can be set according to the requirements of the light receiving device 1, such as when using a semiconductor light receiving element 4 with a small light receiving diameter to suppress dark current.

Figure 10:
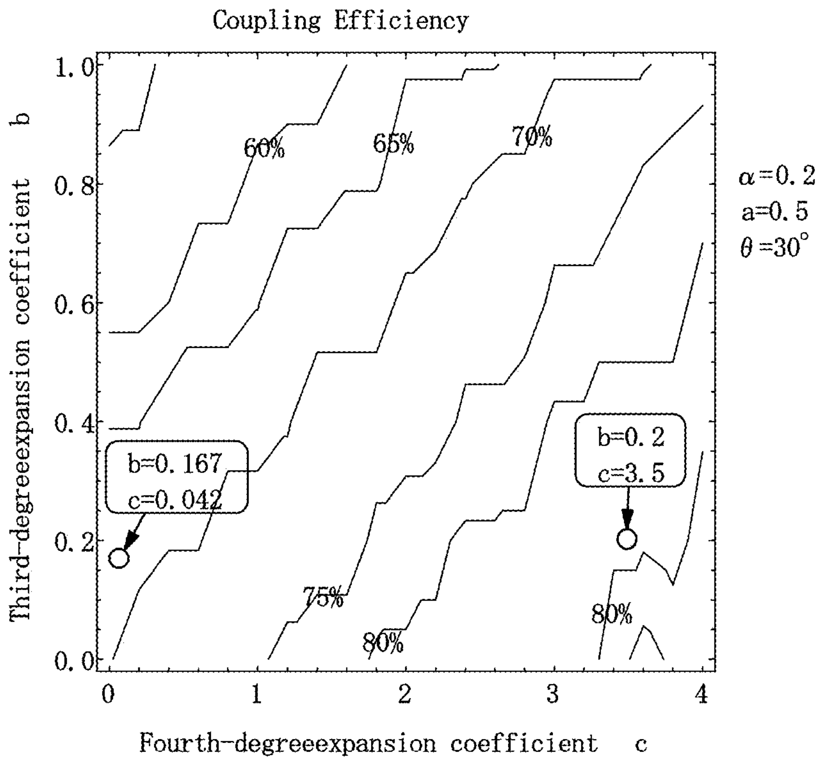
FIG. 10 is a diagram showing the relationship between a third-order expansion coefficient, a fourth-order expansion coefficient, and coupling efficiency of a reflective surface expressed by a fourth-order approximation polynomial.

In the case of the reflective surface 7 expressed by the approximate polynomial in equation (2) above, the shape of the reflective surface 7 can be adjusted by adjusting the expansion coefficients b and c of the third-order and fourth-order terms in addition to the coefficient $\alpha$ can be optimized. FIG. 10 shows an example of the relationship between expansion coefficients b and c and coupling efficiency when $\alpha=0.2$ and a=0.5. Based on this relationship, the coupling efficiency can be improved compared to the case where the exponential function of equation (1) above is expanded as $b=0.167(\approx 1/(3!))$, $c=0.042(\approx 1/(4!))$.

For example, when the expansion coefficients are adjusted to b=0.167 and c=0.3, the coupling efficiency is about 70%. In this case, as shown in FIG. 3, the diameter of the reflective surface 7 on the semiconductor light receiving element 4 side becomes larger than in the case of an exponential function, and the diameter of the reflective surface 7 is closer to the center line C in parallel than in the case of an exponential function on the condensing lens 2 side. Therefore, in the reflective surface 7 expressed by this approximate polynomial, the effect of returning light to the condensing lens 2 side is relaxed compared to the case of an exponential function, thereby reducing the amount of light returning to the condensing lens 2 side, and increasing the coupling efficiency.

Further, for example, when b=0.2 and c=3.5, a coupling efficiency of 80.8% can be obtained. In this case, the reflective surface 7 has a shape in which the diameter decreases halfway from the condensing lens 2 toward the semiconductor light receiving element 4, and then gradually increases in diameter on the semiconductor light receiving element 4 side. This reflective surface 7 has the effect of increasing the directional component of light toward the semiconductor light receiving element 4 in the direction of the center line C on the side of the semiconductor light receiving element 4 where the diameter increases. Therefore, less light returns to the condensing lens 2 side than the reflective surface 7 expressed by an exponential function, and the coupling efficiency improves.

Figure 11:
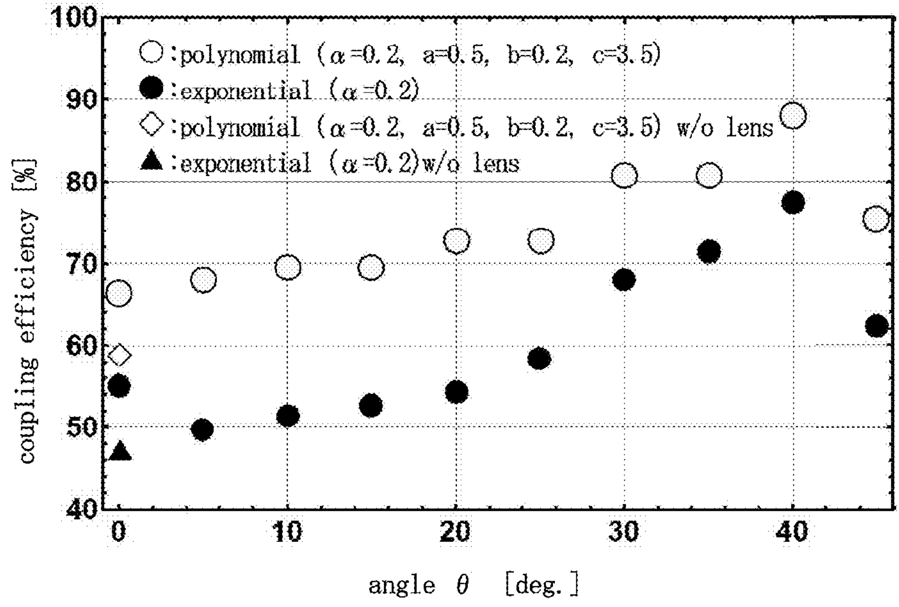
FIG. 11 is a diagram showing the relationship between the inclination of the optical axis of the convex lens surface of a compound eye lens and the coupling efficiency for a reflective surface expressed by an exponential function and a reflective surface expressed by an approximate polynomial.

FIG. 11 shows an example of comparing the coupling efficiency when the reflective surface 7 is expressed by an exponential function and when it is expressed by an approximate polynomial by changing the intersection angle $\theta$ of the plurality of convex lens surfaces 40 of the condensing lens 2. In both cases of expression using an exponential function and expression using an approximate polynomial, the coupling efficiency is particularly improved when the intersection angle $\theta=30°$ to $40°$. It can also be seen that if the intersection angle $\theta$ is the same, the approximate polynomial has a higher coupling efficiency, and the shape of the reflective surface 7 is optimized by adjusting the expansion coefficients b and c.

Next, the formation of a compound eye lens in which the optical axes of the plurality of convex lens surfaces 14 are tilted respectively so as to intersect the center line C of the reflective surface 7 will be described. Since it is not easy to form a plurality of convex lens surfaces 14 with tilted optical axes on a flat surface, the plurality of convex lens surfaces 14 are formed on a surface formed in a convex shape.

Figure 12:
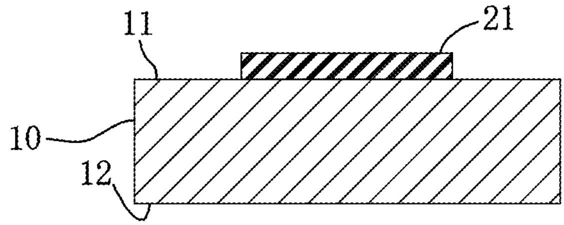
FIG. 12 is an explanatory diagram of a first resist film forming step for forming a convex surface.
Figure 13:
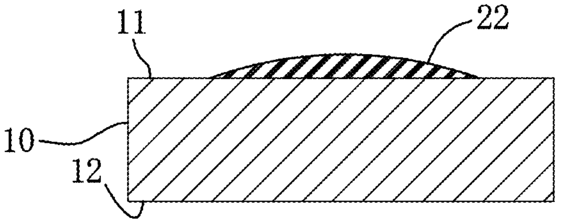
FIG. 13 is an explanatory diagram of a first resist mask forming step for forming a convex surface.

As shown in FIG. 12, a first resist film 21 is formed in the center of the first surface 11 of the semiconductor substrate 10 in a circular shape in plan view, with the center of this circle coinciding with the center of the semiconductor substrate 10 (first resist film forming process). Next, by heating this semiconductor substrate 10 to, for example, about 150° C. to melt the first resist film 21, a first resist mask 22 having a plano-convex lens shape is formed using the surface tension of the melted first resist film 21 as shown in FIG. 13. (first resist mask forming step).

Figure 14:
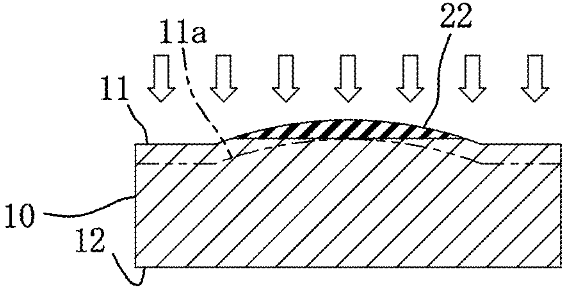
FIG. 14 is an explanatory diagram of a convex surface etching process.

Next, as shown in FIG. 14, the first surface 11 side of the semiconductor substrate 10 is etched by reactive ion etching (RIE) until the first resist mask 22 is removed (convex surface etching step). In this way, a convex surface 11*a* reflecting the shape of the first resist mask 22 is formed on the first surface 11 of the semiconductor substrate 10. Note that the flat surface around the convex surface 11*a* becomes the first surface 11 of the semiconductor substrate 10 exposed by etching.

Figure 15:
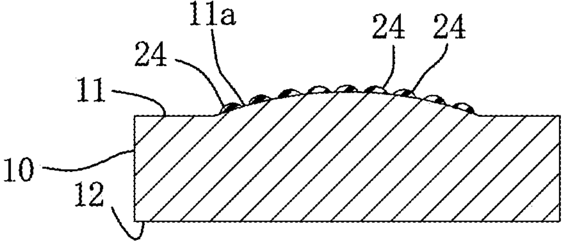
FIG. 15 is an explanatory diagram of a second resist mask forming process for forming a plurality of convex lens surfaces.

Next, as shown in FIG. 15, a plurality of convex lens-shaped second resist masks 24 are formed using the same method as for forming the first resist mask 22 (second resist mask forming step). Specifically, a plurality of second resist films for forming a plurality of convex lens surfaces 14 are formed on the convex surface 11*a* and heated, and the surface tension of the second resist film is used to form a plurality of convex lens shaped resist films 2 as a second resist mask 24.

Figure 16:
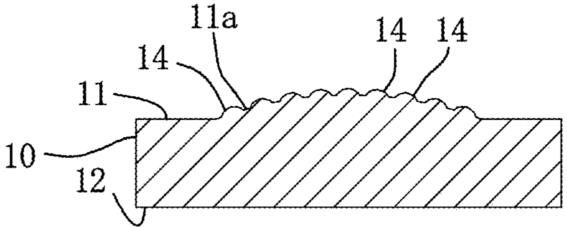
FIG. 16 is an explanatory diagram of a compound eye lens formed on a convex surface.
Figure 17:
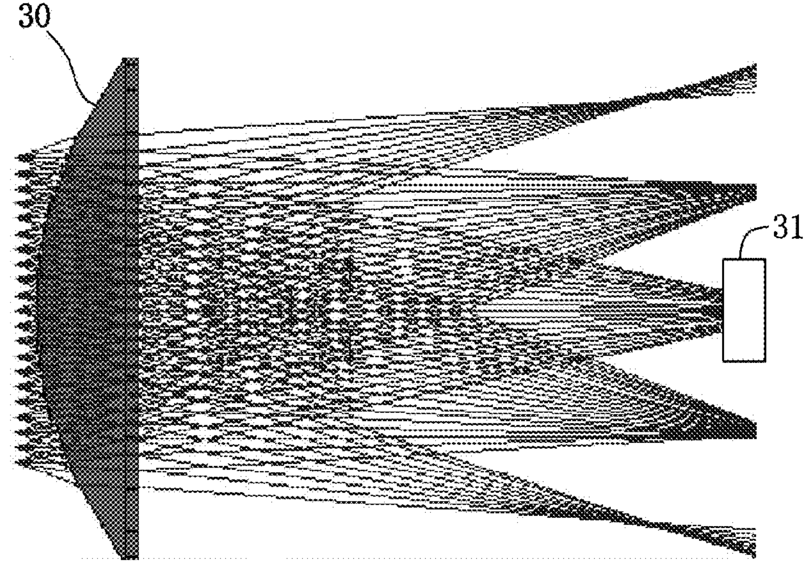
FIG. 17 is an example of a ray tracing simulation result when diffused light is incident on a light receiving device equipped with a plano-convex lens as a condensing lens.

Next, although not shown, the first surface 11 side of the semiconductor substrate 10 is etched by reactive ion etching (RIE) until the plurality of second resist masks 24 are removed, as shown in FIG. 13. In this way, as shown in FIG. 16, a plurality of convex lens surfaces 14 reflecting the shapes of the plurality of second resist masks 24 are formed on the convex surface 11*a*. Note that the area around the plurality of convex lens surfaces 14 becomes a convex surface 11*a* exposed by etching, and the flat surface around this convex surface 11*a* becomes the first surface 11 of the semiconductor substrate 10 exposed by etching.

As described above, a plurality of partially spherical convex lens surfaces 14 having a smaller radius of curvature than the convex surface 11*a* are integrally formed on the partially spherical convex surface 11*a* formed on one surface (first surface 11) of the semiconductor substrate 10. Thereby, the condensing lens 2, which is a compound eye lens, is formed. The center of the circular contour of the convex surface 11*a* is aligned with the center of the condensing lens 2. Although the description has been made using the semiconductor substrate 10 in the form of individual pieces, it is also possible to form a plurality of compound eye lenses at once on the semiconductor substrate 10 in the form of a wafer, and then divide the semiconductor substrate 10 into individual pieces.

Since a plurality of convex lens surfaces 14 are formed along the convex surface 11*a* of the condensing lens 2, the further the distance from the center of the condensing lens 2, the more the intersection angle between the optical axis passing through the center line C of the reflective surface 7 and the center of a plurality of convex lens surface 14 becomes larger. For example, by adjusting the viscosity of the first resist film 21, the radius of curvature of the convex surface 11*a* can be adjusted, and the intersection angle θ of the optical axes of the plurality of convex lens surfaces 14 can be adjusted.

Among the plurality of convex lens surfaces 14 integrally formed on the convex surface 11*a*, the convex lens surfaces 14 corresponding to the intersection angle θ=5° to 20° in FIG. 8 are close to the center line C and are small in number. Since the intersection angle θ of the plurality of convex lens surfaces 14 on outer area can be set to 25° to 40°, the coupling efficiency is improved. On the other hand, by omitting the formation of the convex surface 11*a* and by integrally forming a plurality of convex lens surfaces 14 on the flat first surface 11 in the same manner as described above, a plurality of convex lens surfaces 14 with an intersection angle θ=0° can be formed. It is also possible to form a compound eye lens in the convex surface etching step, etching may be stopped midway to form a convex portion whose center is a flat surface and its outer periphery is a partially spherical inclined surface, and a plurality of convex lens surfaces 14 can be formed on this convex portion.

The functions and effects of the light receiving device 1 will be explained. In the light receiving device 1, a part of the light transmitted through the condensing lens 2, which is a compound eye lens, travels through the optical path section 6 while being reflected by the reflective surface 7 in the lens holder 3, and enters the semiconductor light receiving element 4. Since the condensing lens 2 is a compound eye lens, the diffused light that enters the entire condensing lens 2 from various directions can be condensed into the optical path section 6 toward the semiconductor light receiving element 4 by the plurality of convex lens surfaces 14. The cylindrical reflective surface 7 facing the optical path section 6, whose diameter becomes smaller as it approaches the semiconductor light receiving element 4 and whose diameter decreasing rate decreases as it approaches the semiconductor light receiving element 4, reflects a portion of the light that has passed through the condensing lens 2 and condenses to make incident on the semiconductor light receiving element 4 whose diameter is smaller than that of the condensing lens 2. Therefore, the light receiving device 1 can improve the coupling efficiency when diffused light is incident.

In the case of the reflective surface 7 expressed by an exponential function, the diameter of the cylindrical reflective surface 7 decreases exponentially as the distance from the condensing lens 2 approaches the semiconductor light receiving element 4. The rate of decreasing of the diameter becomes smaller same as above. When reflecting light, this reflective surface 7 increases the direction component of the light toward the condensing lens 2 side in the direction of the center line C and decreases the direction component toward the semiconductor light receiving element 4 side. It has the effect of returning the light to the condensing lens 2 side. The closer to the semiconductor light receiving element 4, the cylindrical reflective surface 7 approaches to the center line C in parallel, and the inclination of the reflective surface 7 with respect to the center line C becomes smaller. The effect of returning the light to the condensing lens 2 side is alleviated. Therefore, when the light that passes through the condensing lens 2, is reflected and condensed by the reflective surface 7, and when the light is reflected multiple times by the reflective surface 7, it becomes difficult to return to the condensing lens 2 side, which improves the coupling efficiency.

In the case of the reflective surface 7 expressed by an approximate polynomial of an exponential function, the diameter of the cylindrical reflective surface 7 becomes exponentially smaller as it gets further away from the condensing lens 2 and closer to the semiconductor light receiving element 4. AS same as above, the diameter decreasing rate decreases. When reflecting light, this reflective surface 7 increases the direction component of the light toward the condensing lens 2 side in the direction of the center line C and decreases the direction component toward the semiconductor light receiving element 4 side. It has the effect of returning the light to the condensing lens 2 side. Since the diameter of the reflective surface 7 on the semiconductor light receiving element 4 side is larger than in the case of an exponential function, the reflective surface 7 becomes closer to the center line C in parallel on the condensing lens 2 side than in the case of an exponential function, the effect of returning the light to the condensing lens 2 side is alleviated. Therefore, when the light that passes through the condensing lens 2, is reflected and condensed by the reflective surface 7, and when the light is reflected multiple times by the reflective surface 7, it becomes difficult to return to the condensing lens 2 side, which improves the coupling efficiency.

When the coefficient α of the exponential function satisfies $0.1 \leq \alpha \leq 0.2$, the inclination of the reflective surface 7 with respect to the center line C is optimized, and the coupling efficiency can be improved.

The condensing lens 2 is a compound eye lens having a plurality of convex lens surfaces 14 arranged along a partially spherical convex surface 11*a*. As a result, the optical axes of the plurality of convex lens surfaces 14 are tilted toward the semiconductor light receiving element 4, making it easier for the light transmitted through the condensing lens 2 to enter the semiconductor light receiving element 4.

The condensing lens 2 is a compound eye lens having a plurality of convex lens surfaces 14, and the more the distance from the center line C of the reflective surface 7 passing through the center of the condensing lens 2, the more the optical axis of the convex lens surface 14 becomes tilted relative to the center line C. As a result, the optical axes of the plurality of convex lens surfaces 14 are tilted toward the semiconductor light receiving element 4, so that the light transmitted through the condensing lens 2 can be made easier to enter the semiconductor light receiving element 4.

The condensing lens 2 having a plurality of convex lens surfaces 14 is a compound eye lens in which a plurality of convex lens surfaces 14 are integrally formed on a silicon substrate as a semiconductor substrate 10 that can be processed with high precision using semiconductor manufacturing technology. Therefore, a light receiving device 1 suitable for spectroscopic analysis using infrared light transmitted through a silicon substrate can be formed.

The number and size of the plurality of convex lens surfaces 14, the size of the convex surface 11*a*, the size and shape of the reflective surface 7, the size of the semiconductor light receiving element 4, etc. can be set as appropriate based on the performance etc. required of the light receiving device 1. In addition, those skilled in the art can implement various modifications to the embodiments described above without departing from the spirit of the present invention, and the present invention includes such modifications.

The invention claimed is:

1. A light receiving device comprising a condensing lens, a lens holder that supports the condensing lens, a semiconductor light receiving element, and a base for fixing the semiconductor light receiving element and the lens holder, in which the light transmitted through the condensing lens enters the semiconductor light receiving element through an optical path section in the lens holder; wherein the condensing lens is a compound eye lens having a plurality of convex lens surface on one side, the lens holder has a cylindrical reflective surface facing the optical path section having a circular cross section and formed such that a diameter and a diameter decreasing rate becomes smaller as approaches the semiconductor light receiving element from the condensing lens, and a part of the light transmitted through the condensing lens is reflected by the reflective surface and enters the semiconductor light receiving element.

2. The light receiving device according to claim 1, wherein when a distance from the condensing lens is x on a center line of the reflective surface passing through a center of the condensing lens, a coefficient is $\alpha$, and an aperture radius of the reflective surface on the condensing lens side is A, the reflective surface is formed along a rotational curved surface obtained by rotating a curved line represented by an exponential function $A\times\exp(-\alpha x)$ about the center line.

3. The light receiving device according to claim 1, when a distance from the condensing lens is x on a center line of the reflective surface passing through a center of the condensing lens, a coefficient is $\alpha$, and an aperture radius of the reflective surface on the condensing lens side is A, the reflective surface is formed along a rotational curved surface obtained by rotating a curved line represented by an approximate polynomial $A\times(1-\alpha x+a(\alpha x)^2-b(\alpha x)^3+c(\alpha x)^4$ that is an expansion of an exponential function $A\times\exp(-\alpha x)$ up to fourth order term about the center line and is formed such that a diameter of the reflective surface on the semiconductor light receiving element side is larger than that is obtained by the exponential function.

4. The light receiving device according to claim 2, wherein the coefficient $\alpha$ of the exponential function satisfies $0.1\leq\alpha\leq0.2$.

5. The light receiving device according to claim 1, wherein the condensing lens is a compound eye lens comprising a plurality of the convex lens surface having a radius of curvature smaller than that of a partially spherical convex surface that is formed on one side of the condensing lens.

6. The light receiving device according to claim 1, wherein the condensing lens is a compound eye lens such that the farther it is from the center line of the reflective surface passing through the center of the condensing lens, the larger an intersection angle between the center line and the optical axis passing through the center of the convex lens surface.

7. The light receiving device according to claim 1, wherein the condensing lens is a compound eye lens in which a plurality of convex lens surfaces are integrally formed on a silicon substrate, and the semiconductor light receiving element receives infrared light.

* * * * *